(12) United States Patent
Bae et al.

(10) Patent No.: US 11,737,319 B2
(45) Date of Patent: *Aug. 22, 2023

(54) DISPLAY APPARATUS INCLUDING A BLOCKING LAYER AND METHOD OF MANUFACTURING THE SAME

(71) Applicant: SAMSUNG DISPLAY CO., LTD., Yongin-si (KR)

(72) Inventors: Injun Bae, Yongin-si (KR); Chulho Kim, Yongin-si (KR); Yunhwan Park, Yongin-si (KR); Jin Jeon, Yongin-si (KR); Beohmrock Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/592,658

(22) Filed: Feb. 4, 2022

(65) Prior Publication Data
US 2022/0157906 A1 May 19, 2022

Related U.S. Application Data

(63) Continuation of application No. 16/551,076, filed on Aug. 26, 2019, now Pat. No. 11,271,055.

(30) Foreign Application Priority Data

Jan. 16, 2019 (KR) .......................... 10-2019-0005858

(51) Int. Cl.
*H10K 59/124* (2023.01)
*H10K 59/123* (2023.01)
(Continued)

(52) U.S. Cl.
CPC ......... *H10K 59/124* (2023.02); *H10K 59/123* (2023.02); *H10K 59/131* (2023.02); *H10K 59/10* (2023.02)

(58) Field of Classification Search
None
See application file for complete search history.

(56) References Cited

U.S. PATENT DOCUMENTS

| 10,283,578 B2 | 5/2019 | Ka et al. |
| 11,271,055 B2 * | 3/2022 | Bae ...................... H01L 27/3276 |

(Continued)

FOREIGN PATENT DOCUMENTS

| KR | 10-2015-0080257 | 7/2015 |
| KR | 10-2016-0057015 | 5/2016 |

(Continued)

*Primary Examiner* — Telly D Green
(74) *Attorney, Agent, or Firm* — F. Chau & Associates, LLC

(57) ABSTRACT

A display apparatus includes: a substrate including a display area and a sensor area, wherein the display area includes a first pixel, and the sensor area includes a second pixel and a transmission portion; a sensor configured to transmit a signal through the substrate via the transmission portion, wherein the second pixel includes second thin-film transistor including a semiconductor layer, and wherein a blocking layer is disposed between the sensor and the second thin-film transistor, wherein the blocking layer covers the semiconductor layer.

11 Claims, 10 Drawing Sheets

(51) Int. Cl.
    *H10K 59/10*         (2023.01)
    *H10K 59/131*       (2023.01)

(56)          References Cited

U.S. PATENT DOCUMENTS

| | | |
|---|---|---|
| 2009/0161051 A1 | 6/2009 | Fukunaga et al. |
| 2011/0090420 A1 | 4/2011 | Kim et al. |
| 2012/0044444 A1 | 2/2012 | Park et al. |
| 2012/0248452 A1 | 10/2012 | Yeo et al. |
| 2015/0048316 A1 | 2/2015 | Choi et al. |
| 2016/0133678 A1 | 5/2016 | Beak et al. |
| 2016/0133682 A1 | 5/2016 | Kim et al. |
| 2016/0141349 A1 | 5/2016 | Yun et al. |
| 2017/0278909 A1 | 9/2017 | Jeon et al. |
| 2018/0069068 A1 | 3/2018 | Ka et al. |
| 2018/0107241 A1 | 4/2018 | Evans, V et al. |
| 2018/0212060 A1 | 7/2018 | Kang et al. |
| 2019/0245011 A1 | 8/2019 | Lius |
| 2020/0227494 A1 | 7/2020 | Bae et al. |

FOREIGN PATENT DOCUMENTS

| | | |
|---|---|---|
| KR | 10-2016-0066680 | 6/2016 |
| KR | 10-2018-0088099 | 8/2018 |

* cited by examiner

DISPLAY APPARATUS INCLUDING A BLOCKING LAYER AND METHOD OF MANUFACTURING THE SAME

CROSS-REFERENCE TO RELATED APPLICATIONS

This application is a continuation of U.S. patent application Ser. No. 16/551,076 filed on Aug. 26, 2019 which claims priority under 35 U.S.C. § 119 to Korean Patent Application No. 10-2019-0005858, filed on Jan. 16, 2019, in the Korean Intellectual Property Office, the disclosures of which are incorporated by reference herein in their entireties.

TECHNICAL FIELD

Exemplary embodiments of the present inventive concept relate to a display apparatus and a method of manufacturing the same, and more particularly, to display apparatus including a blocking layer and a method of manufacturing the same.

DISCUSSION OF THE RELATED ART

Generally, display apparatuses have various purposes. In addition, as display apparatuses have become thinner and lighter, the display apparatuses have become increasingly widely used.

As the display apparatuses are variously utilized, various methods may be used to design forms of the display apparatuses. In addition, functions that may be combined or linked with the display apparatuses are also increasing.

SUMMARY

According to an exemplary embodiment of the present inventive concept, a display apparatus includes: a substrate including a display area and a sensor area, wherein the display area includes a first pixel, and the sensor area includes a second pixel and a transmission portion; a sensor configured to transmit a signal through the substrate via the transmission portion, wherein the second pixel includes second thin-film transistor including a semiconductor layer, and wherein a blocking layer is disposed between the sensor and the second thin-film transistor, wherein the blocking layer covers the semiconductor layer.

In an exemplary embodiment of the present inventive concept, the blocking layer has a same pattern as a pattern of the semiconductor layer in the second thin-film transistor.

In an exemplary embodiment of the present inventive concept, a width of the pattern of the blocking layer is greater than a width of the pattern of the semiconductor layer in the second thin-film transistor.

In an exemplary embodiment of the present inventive concept, the blocking layer has a different pattern from a pattern of the semiconductor layer in the second thin-film transistor.

In an exemplary embodiment of the present inventive concept, a thickness of the blocking layer is about 800 Å or greater.

In an exemplary embodiment of the present inventive concept, buffer layers are arranged between the second thin-film transistor and the blocking layer and between the blocking layer and the substrate, respectively.

In an exemplary embodiment of the present inventive concept, the second pixel further includes an organic light-emitting diode connected to the second thin-film transistor.

In an exemplary embodiment of the present inventive concept, the first pixel includes a first thin-film transistor including a semiconductor layer, and wherein a blocking layer is arranged between the sensor and the first thin-film transistor to cover the semiconductor layer in the first thin-film transistor.

In an exemplary embodiment of the present inventive concept, the first pixel further includes an organic light-emitting diode connected to the first thin-film transistor.

In an exemplary embodiment of the present inventive concept, the signal includes an optical signal and/or a sound signal.

According to an exemplary embodiment of the present inventive concept, a method of manufacturing a display apparatus including: forming a display area and a sensor area on a substrate, wherein the display area includes a main pixel, and the sensor area includes an auxiliary pixel and a transmission portion; arranging on a side of the substrate a sensor configured to transmit a signal through the substrate via the transmission portion; and forming a blocking layer between the sensor and the auxiliary pixel, wherein the auxiliary pixel includes an auxiliary thin-film transistor including a semiconductor layer, and the blocking layer covers the semiconductor layer of the auxiliary thin-film transistor.

In an exemplary embodiment of the present inventive concept, the blocking layer is formed to have a same pattern as a pattern of the semiconductor layer of the auxiliary thin-film transistor.

In an exemplary embodiment of the present inventive concept, a width of the pattern of the blocking layer is greater than a width of the pattern of the semiconductor layer of the auxiliary thin-film transistor.

In an exemplary embodiment of the present inventive concept, the blocking layer has a different pattern from a pattern of the semiconductor layer of the auxiliary thin-film transistor.

In an exemplary embodiment of the present inventive concept, a thickness of the blocking layer is about 800 Å or greater.

In an exemplary embodiment of the present inventive concept, buffer layers are arranged between the auxiliary thin-film transistor and the blocking layer and between the blocking layer and the substrate, respectively.

In an exemplary embodiment of the present inventive concept, the auxiliary pixel further includes an organic light-emitting diode connected to the auxiliary thin-film transistor.

In an exemplary embodiment of the present inventive concept, the main pixel further includes a main thin-film transistor including a semiconductor layer, and a blocking layer is disposed between the sensor and the main thin-film transistor, and covers the semiconductor layer of the main thin-film transistor.

In an exemplary embodiment of the present inventive concept, the main pixel further includes an organic light-emitting diode connected to the main thin-film transistor.

In an exemplary embodiment of the present inventive concept, the signal includes an optical signal and/or a sound signal.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawing, wherein.

DETAILED DESCRIPTION

Figure 1:
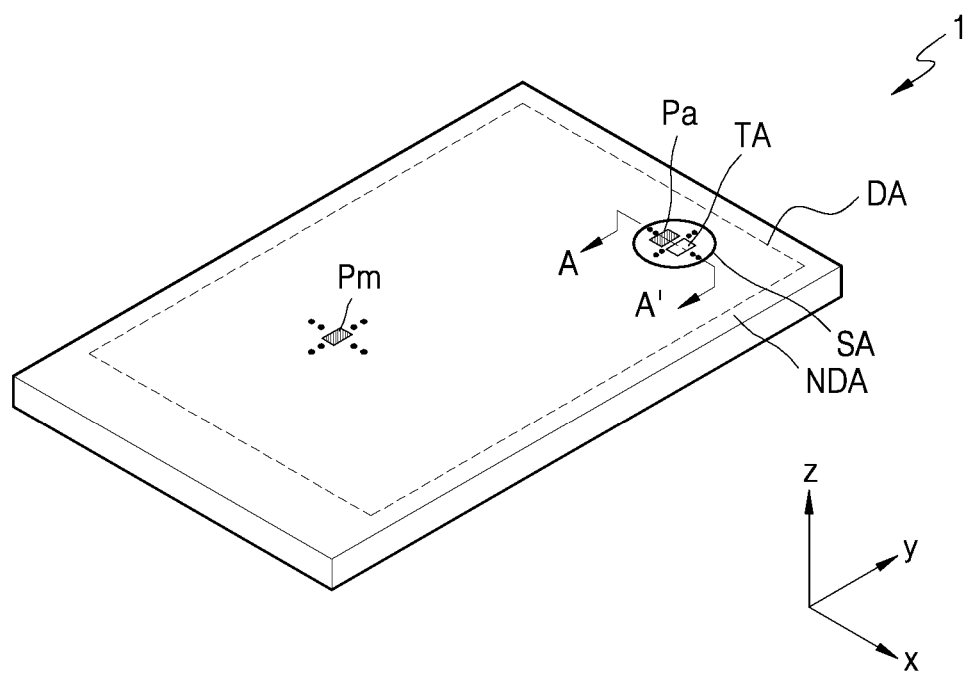
FIG. 1 is a schematic perspective view of a display apparatus according to an exemplary embodiment of the present inventive concept.

Exemplary embodiments of the present inventive concept will now be described more fully with reference to the accompanying drawings. It is to be understood that the present inventive concept may be embodied in different forms and thus should not be construed as being limited to the exemplary embodiments set forth herein. It is to be understood that like reference numerals may refer to like elements throughout the specification.

Sizes of elements in the drawings may be exaggerated for clarity.

Hereinafter, embodiments will be described in detail with reference to the attached drawings.

FIG. 1 is a schematic perspective view of a display apparatus 1 according to an exemplary embodiment of the present inventive concept.

Referring to FIG. 1, the display apparatus 1 includes a display area DA configured to display an image and a non-display area NDA configured not to display an image. The display apparatus 1 may provide an image by using light emitted from a plurality of main pixels Pm arranged in the display area DA.

The display apparatus 1 includes a sensor area SA. For example, the sensor area SA may be provided below an area in which a component 20 such as a sensor using an optical signal or a sound signal is arranged. This will be described later with reference to FIG. 2. The sensor area SA may include a transmission portion TA through which an optical signal and/or a sound signal is transmitted. The optical signal and/or sound signal may each be output from the component 20 to outside (e.g., an external device) or may be output from the outside toward the component 20. According to an exemplary embodiment of the present inventive concept, when infrared light passes through the sensor area SA, light transmittance may be about 10% or greater. According to an exemplary embodiment of the present inventive concept, the light transmittance may be about 20% or greater, about 25% or greater, about 50% or greater, about 85% or greater, or about 90% or greater.

According to the present embodiment, in the sensor area SA, a plurality of auxiliary pixels Pa may be arranged and an image may be provided by using light emitted from the auxiliary pixels Pa. The image provided in the sensor area SA is an auxiliary image, and may have a lower resolution than an image provided in the display area DA by the main pixels Pm. For example, since the sensor area SA includes the transmission portion TA through which an optical signal and/or a sound signal may pass, the number of auxiliary pixels Pa that may be arranged in a unit area may be less than the number of main pixels Pm arranged in the unit area of the display area DA.

The sensor area SA may be at least partially surrounded by the display area DA. For example, FIG. 1 shows that the whole sensor area SA is surrounded by the display area DA.

Hereinafter, according to an exemplary embodiment of the present exemplary embodiment of the present inventive concept, an organic light-emitting display apparatus is described as an example of the display apparatus 1. However, the present inventive concept is not limited thereto. According to an exemplary embodiment of the present inventive concept, various types of display apparatuses such as an inorganic electroluminescence (EL) display apparatus, a quantum dot light-emitting display, etc. may be used.

FIG. 1 shows that the sensor area SA is arranged on a part (e.g., an upper right part) of the display area DA having a rectangular shape. However, the present inventive concept is not limited thereto. The display area DA may have a shape such as a circle, an oval, or a polygon, for example, a triangle or a pentagon, or the like. The number of sensor areas SA and/or a location of the sensor area SA may be variously changed.

Figure 2:
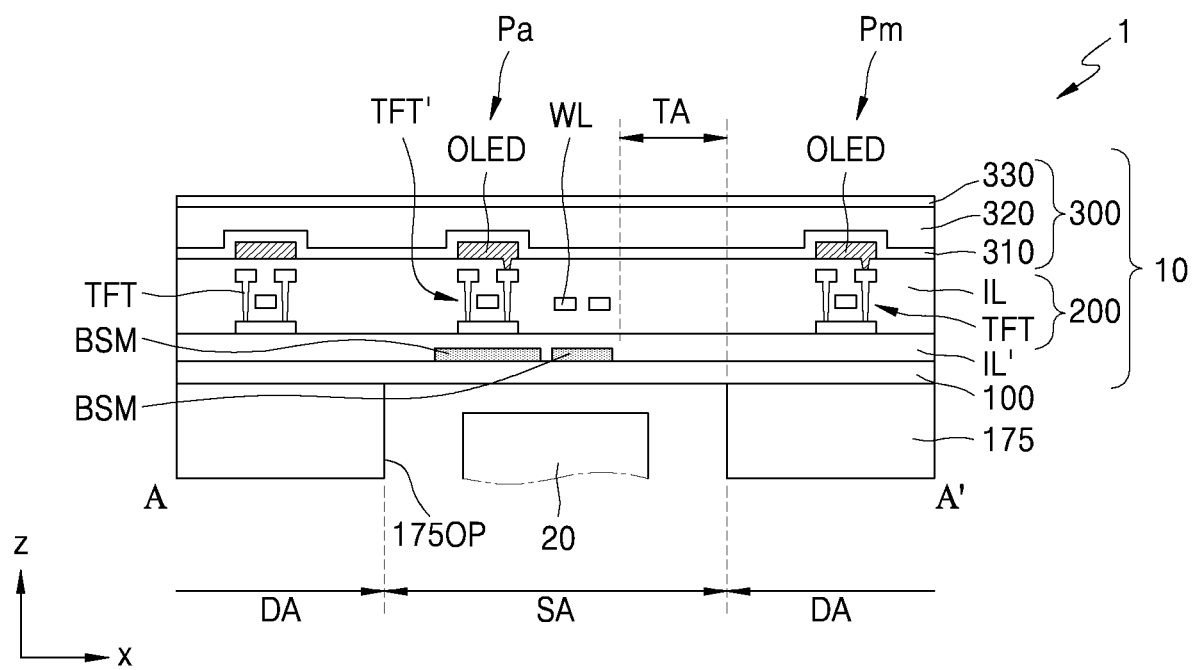
FIG. 2 is a cross-sectional view of the display apparatus taken along a line A-A' of FIG. 1, according to an exemplary embodiment of the present inventive concept.

FIG. 2 is a schematic cross-sectional view of the display apparatus 1 according to an exemplary embodiment of the present inventive concept. The schematic cross-sectional view of the display apparatus 1 shown in FIG. 2 may correspond to a line A-A' of FIG. 1.

Referring to FIG. 2, the display apparatus 1 may include a display panel 10 including a display element. The display apparatus 1 may further include the component 20 corresponding to the sensor area SA.

The display panel 10 may include a substrate 100, a display element layer 200 disposed on the substrate 100, and a thin-film encapsulation layer 300 as a sealing member configured to seal the display element layer 200. In addition, the display panel 10 may further include a lower protective film 175 disposed below the substrate 100.

The substrate 100 may include, for example, glass or a polymer resin. For example, the polymer resin may include polyethersulphone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), cellulose acetate propionate (CAP), and/or the like. The substrate 100 including a polymer resin may be flexible, rollable, and/or bendable. The substrate 100 may have a multi-layered structure including a layer including the above-described polymer resin, and an inorganic layer.

The display element layer 200 may include a circuit layer including a main thin-film transistor TFT and an auxiliary thin-film transistor TFT', an organic light-emitting diode OLED as the display element, and insulating layers IL and IL' disposed in a periphery of the circuit layer and the organic light-emitting diode OLED.

In the display area DA, the main pixels Pm are arranged therein and may include the main thin-film transistor TFT and the organic light-emitting diode OLED (e.g., a first OLED) connected to the main thin-film transistor TFT. In the sensor area SA, the auxiliary pixels Pa and wires WL may be arranged therein and may include the auxiliary thin-film transistor TFT' and the organic light-emitting diode OLED (e.g., a second OLED) connected to the auxiliary thin-film transistor TFT'.

In addition, in the sensor area SA, the transmission portion TA may be arranged therein and might not include the auxiliary thin-film transistor TFT and the display element. The transmission portion TA may be understood as an area transmitting an optical signal and/or a sound signal, each emitted from the component 20, or an optical signal incident and/or a sound signal, each received by the component 20 from the external device.

The component 20 may be arranged in the sensor area SA. The component 20 may be an electronic element using light or sound. For example, the component 20 may be a sensor configured to receive and use light, such as an infrared sensor, a sensor configured to measure a distance or recognize a fingerprint by outputting and detecting light or sound, a small lamp configured to output light, a speaker configured to output sound, etc. For example, the component 20 may be a combination of the sensor configured to measure a distance or recognize a fingerprint by outputting and detecting light or sound, the small lamp configured to output light, and the speaker configured to output sound. When the component 20 is an electronic element using light, the component 20 may use light of various wavelengths, such as visible light, infrared light, and/or ultraviolet light. A plurality of components 20 may be arranged in the sensor area SA. For example, a light-emitting device and a light-receiving device may be included as components 20 in a sensor area SA. In addition, a light-emitting unit and a light-receiving unit may be included in one component 20.

In the current embodiment, a blocking layer BSM may be arranged in the sensor area SA. The blocking layer BSM may be arranged below the wires WL and the auxiliary thin-film transistor TFT to correspond to the wires WL and the auxiliary thin-film transistor TFT'. For example, the blocking layer BSM may overlap the wires WL and the auxiliary thin-film transistor TFT. The blocking layer BSM may block external light from reaching the auxiliary pixels Pa including the wires WL and the auxiliary thin-film transistor TFT'. For example, the blocking layer BSM may block light emitted from the component 20 from reaching the wires WL and the auxiliary pixels Pa.

An electrostatic voltage or a signal is applied to the blocking layer BSM to thereby prevent a pixel circuit from being damaged by an electrostatic discharge. In addition, the blocking layer BSM has an arrangement that may correspond with the auxiliary pixels Pa in a plan view. This will be described later in detail.

The thin-film encapsulation layer 300 may include at least one inorganic encapsulation layer and at least one organic encapsulation layer. In relation to this, FIG. 2 shows first and second inorganic encapsulation layers 310 and 330 and an organic encapsulation layer 320 disposed therebetween.

The first and second inorganic encapsulation layers 310 and 330 may include at least one inorganic insulating material, such as aluminum oxide, titanium oxide, tantalum oxide, hafnium oxide, zinc oxide, silicon oxide, silicon nitride, and/or silicon oxynitride.

For example, the organic encapsulation layer 320 may include PET, PEN, PC, PI, polyethylene sulfonate, polyoxymethylene, polyarylate, hexamethyldisiloxane, acrylic-based resin (e.g., polymethyl methacrylate, polyacrylic acid, etc.) or a combination thereof.

The lower protective film 175 is attached to a lower surface of the substrate 100 to support and protect the substrate 100. The lower protective film 175 may include an opening 1750P corresponding to the sensor area SA. Light transmittance of the sensor area SA may be increased by arranging the opening 1750P in the lower protective film 175. The lower protective film 175 may include, for example, PET or PI.

A size of the sensor area SA may be greater than that of an area in which the component 20 is arranged. For example, a size of the opening 1750P in the lower protective film 175 might not match a size of the sensor area SA. For example, a size of the opening 1750P may be less than that of the sensor area SA.

Although not illustrated, on the display panel 10, an input detection member configured to detect a touch input, a reflection prevention member including a polarizer, a retarder, a color filter, and/or a black matrix, and an element such as a transparent window may be further arranged.

In the current embodiment, it is shown that a thin-film encapsulation layer 300 is used as an encapsulation member configured to seal the display element layer 200. However, the present inventive concept is not limited thereto. For example, as a member configured to seal the display element layer 200, an encapsulation substrate adhered to the substrate 100 by using a sealant or a frit may be used.

Figure 3:
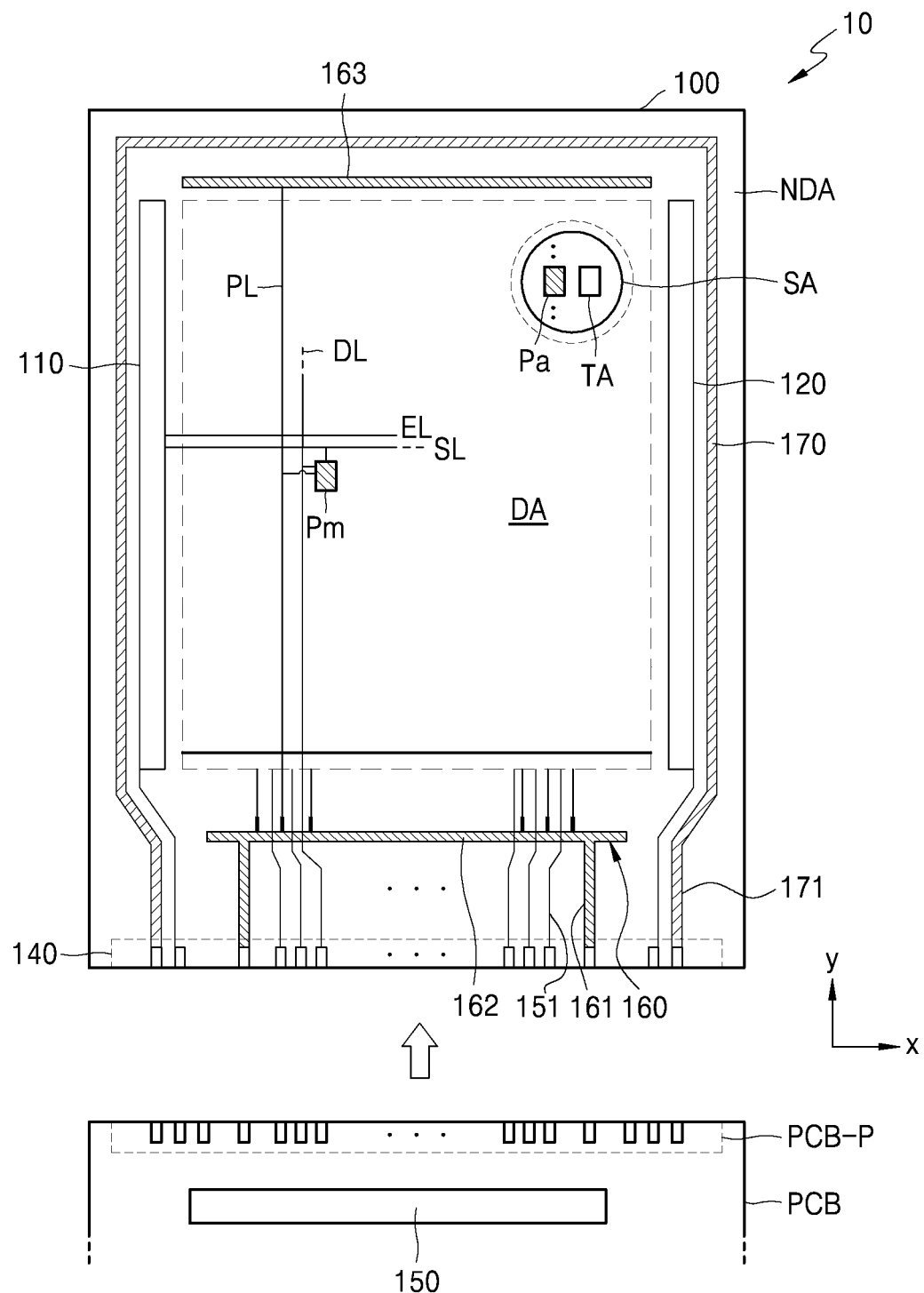
FIG. 3 is a plan view of the display apparatus of FIG. 1, according to an exemplary embodiment of the present inventive concept.

FIG. 3 is a plan view of a wiring structure of the display apparatus 1 of FIG. 1, according to an exemplary embodiment of the present inventive concept.

Referring to FIG. 3, the display panel 10 includes the plurality of main pixels Pm in the display area DA. The main pixels Pm may each include a display element such as an organic light-emitting diode. Each of the main pixels Pm may emit, for example, red, green, blue, or white light via the organic light-emitting diode. The main pixels Pm herein may be understood as a pixel emitting light of a color of red, green, blue, or white, as described above. The display area DA is covered by the encapsulation member described with reference to FIG. 2 to be protected from external air and/or moisture.

The sensor area SA may be arranged in the display area DA. In the sensor area SA, the plurality of auxiliary pixels Pa are arranged. The auxiliary pixels Pa may each include a display element such as an organic light-emitting diode. Each of the auxiliary pixels Pa may emit, for example, red, green, blue, or white light via the organic light-emitting diode. The auxiliary pixels Pa herein may be understood as a pixel emitting light of a color of red, green, blue, or white, as described above. The sensor area SA may include the transmission portion TA between the auxiliary pixels Pa.

In an exemplary embodiment of the present inventive concept, a main pixel Pm and an auxiliary pixel Pa may include a same pixel circuit. However, the present inventive concept is not limited thereto. A pixel circuit included in a main pixel Pm may be different from that included in the auxiliary pixel Pa.

Since the sensor area SA includes the transmission portion TA, resolution of the sensor area SA may be less than that of the display area DA. For example, resolution of the sensor area SA may be about ½ of the resolution of the display area DA. In an exemplary embodiment of the present inventive concept, resolution of the display area DA may be about 400 ppi or greater, and resolution of the sensor area SA may be about 200 ppi.

Each of the main pixels Pm and the auxiliary pixels Pa may be electrically connected to outer circuits in the non-display area NDA. In the non-display area NDA, a first scan driving circuit 110, a second scan driving circuit 120, a terminal 140, a data driving circuit 150, a first power supply line 160, and a second power supply line 170 may be arranged.

The first scan driving circuit 110 may provide a scan signal to each of the main pixels Pm and the auxiliary pixels Pa via a scan line SL. The first scan driving circuit 110 may provide a light emission control signal to each of the main pixels Pm and the auxiliary pixels Pa via a light emission control line EL. The second scan driving circuit 120 may be arranged in parallel with the first scan driving circuit 110 to have the display area DA disposed therebetween. Some of the main pixels Pm and the auxiliary pixels Pa in the display area DA may be electrically connected to the first scan driving circuit 110. Remaining main pixels Pm and the auxiliary pixels Pa may be connected to the second scan driving circuit 120. According to an exemplary embodiment of the present inventive concept, the second scan driving circuit 120 might not be included.

The terminal 140 may be arranged on a side of the substrate 100. The terminal 140 might not be covered by an insulating layer but may be exposed to be electrically connected to a printed circuit board PCB. A terminal PCB-P of the printed circuit board PCB may be electrically connected to the terminal 140 of the display panel 10. The printed circuit board PCB transmits a signal or power generated from a controller to the display panel 10. A control signal generated by the controller may be transmitted to the first and second scan driving circuits 110 and 120 via the printed circuit board PCB. The controller may provide first and second power voltages ELVDD and ELVSS (shown in FIGS. 4A and 4B to be described later) to the first and second power supply lines 160 and 170, respectively, via first and second connection lines 161 and 171. The first power voltage ELVDD may be provided to each of the main pixels Pm and the auxiliary pixels Pa via a driving voltage line PL connected to the first power supply line 160. The second power voltage ELVSS may be provided to an opposite electrode of each of the main pixels Pm and the auxiliary pixels Pa, each connected to the second power supply line 170.

The data driving circuit 150 is electrically connected to the data line DL. A data signal of the data driving circuit 150 may be provided to each of the main pixels Pm and the auxiliary pixels Pa via a connection line 151 connected to the terminal 140 and the data line DL connected to the connection line 151. FIG. 3 shows that the data driving circuit 150 is arranged on the printed circuit board PCB. According to an exemplary embodiment of the present inventive concept, the data driving circuit 150 may be arranged on the substrate 100. For example, the data driving circuit 150 may be arranged between the terminal 140 and the first power supply line 160.

The first power supply line 160 may include a first subline 162 and a second subline 163. The first subline 162 and the second subline 163 extend in parallel to each other in an x-direction to have the display area DA provided therebetween. The second power supply line 170 may partially surround the display area DA in a loop form of which a side is open. For example, the second power supply line 170 may have a square or rectangular shape with an open side or a "U-shape".

Figure 4:
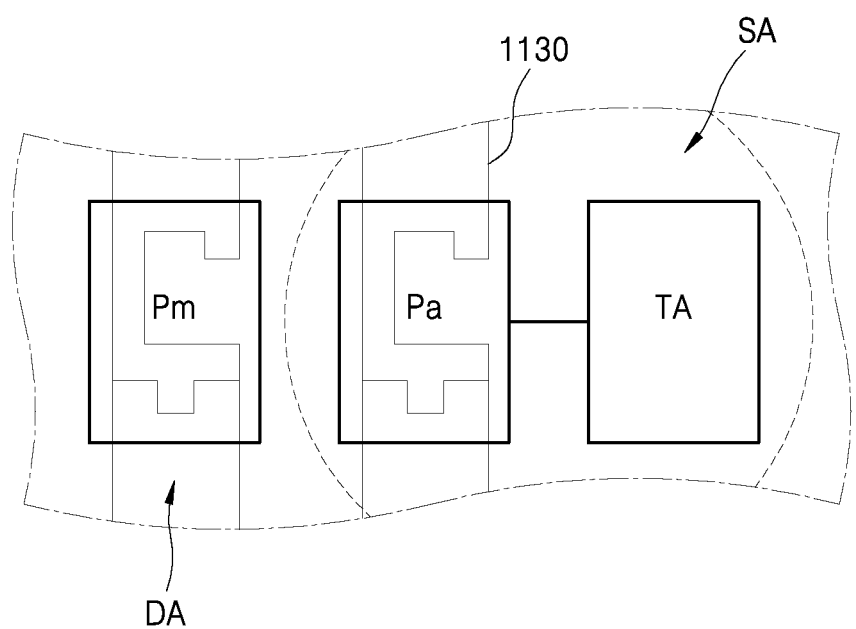
FIG. 4 is a schematic plan view in which an auxiliary pixel and a main pixel are arranged In a periphery of a sensor area of a display panel of FIG. 1, according to an exemplary embodiment of the present inventive concept.

FIG. 4 is a schematic plan view illustrating an auxiliary pixel Pa in the sensor area SA and a main pixel Pm adjacent to the sensor area SA. For example, the auxiliary pixel PA is disposed between the main pixel Pm and the transmission portion TA. A semiconductor layer 1130 is arranged on each of the auxiliary pixel Pa and the main pixel Pm. The semiconductor layer 1130 is an active layer of the auxiliary thin-film transistor TFT and the main thin-film transistor TFT included in the auxiliary pixel Pa and the main pixel Pm, respectively. The semiconductor layer 1130 in the auxiliary pixel Pa includes a same pattern as that in the main pixel Pa. Here, the semiconductor layer 1130 of each of the auxiliary pixel Pa and the main pixel Pm is schematically shown to briefly describe that the blocking layer BSM is arranged to block an optical signal or a sound signal of the component 20 from reaching the semiconductor layer 1130. For example, the semiconductor layer 1130 is properly blocked by the blocking layer BSM to prevent a signal from being distributed in the semiconductor layer 1130 and thus prevent current leakage, etc. Such characteristics will be described later with reference to FIG. 6.

Figure 5:
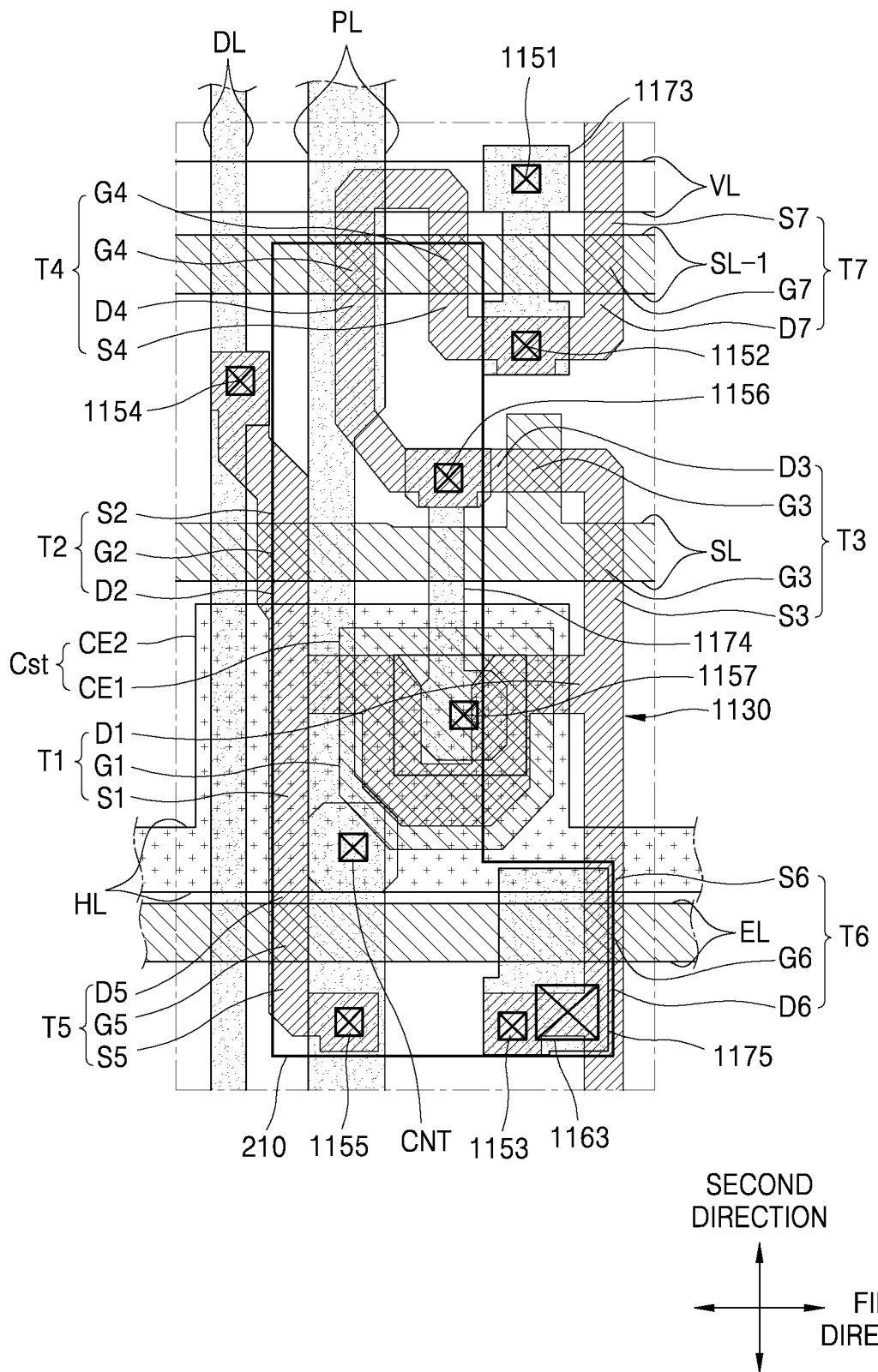
FIG. 5 is an enlarged plan view of the auxiliary pixel of FIG. 4, according to an exemplary embodiment of the present inventive concept.

FIG. 5 is an enlarged plan view in which various wires on the auxiliary pixels Pa overlap each other. The auxiliary pixels Pa have the semiconductor layer 1130 as an element and include 7 thin-film transistors such as a driving thin-film transistor T1, a switching thin-film transistor T2, a compensating thin-film transistor T3, a first initialization driving thin-film transistor T4, an operation-control thin-film transistor T5, a light emission control thin-film transistor T6, and a second initialization driving thin-film transistor T7. It may be understood that the main pixels Pm also have a structure in which such various wires are arranged.

As shown in FIG. 5, the auxiliary thin-film transistor TFT' has a structure in which the driving thin-film transistor T1, the switching thin-film transistor T2, the compensating thin-film transistor T3, the first initialization driving thin-film transistor T4, the operation-control thin-film transistor T5, the light-control thin-film transistor T6, and the second initialization driving thin-film transistor T7 are arranged along the semiconductor layer 1130. The semiconductor layer 1130 is arranged on the substrate 100 on which a first buffer layer 111a (shown in, e.g., FIG. 8) including an inorganic insulating material is arranged.

Some regions of the semiconductor layer 1130 correspond to active layers of the driving thin-film transistor T1, the switching thin-film transistor T2, the compensating thin-film transistor T3, the first initialization driving thin-film transistor T4, the operation-control thin-film transistor T5, the light-control thin-film transistor T6, and the second initialization driving thin-film transistor T7. For example, the active layers of the driving thin-film transistor T1, the switching thin-film transistor T2, the compensating thin-film transistor T3, the first initialization driving thin-film transistor T4, the operation-control thin-film transistor T5, the light-control thin-film transistor T6, and the second initialization driving thin-film transistor T7 are connected to each other and are curved to have various forms. Hereinafter, an active layer may be referred to as a semiconductor layer.

A brief description of the auxiliary thin-film transistors TFT' including the 7 thin-film transistors is as follows.

The driving thin-film transistor T1 includes a driving gate electrode G1 overlapping a driving channel area, and a driving source electrodes S1 and a driving drain electrode at both ends of the driving channel area, respectively. The driving channel area overlapping the driving gate electrode G1 has a bent shape, such as an omega shape, to thereby provide a long channel area in a relatively narrow space. When the driving channel area is long, a gray scale of light emitted from the organic light-emitting diode OLED may be accurately controlled and display quality may be increased since a driving range of a gate voltage is widened.

The switching thin-film transistor T2 includes a switching gate electrode G2 overlapping a switching channel area, and a switching source electrode S2 and a switching drain electrode D2 at both ends of the switching channel area, respectively. The switching drain electrode D2 may be connected to the driving source electrode S1.

The compensation thin-film transistor 13 is a dual thin-film transistor. The compensation thin-film transistor T3 may include compensation gate electrodes G3 overlapping two compensation channel areas, and a compensation source electrode S3 and a compensation drain electrode D3 arranged at both outer ends of the two compensation channel areas, respectively. For example, the compensation thin-film transistor T3 may include two compensation gate electrodes G3 respectively overlapping the two compensation channel areas. The compensation thin-film transistor T3 may be connected to the driving gate electrode G1 of the driving thin-film transistor T1 via a node connection line 1174 that is to be described later.

The first initialization driving thin-film transistor T4 is a dual thin-film transistor. The first initialization driving thin-film transistor T4 may include first initialization gate electrodes G4 overlapping two first initialization channel areas, and a first initialization source electrode S4 and a first initialization drain electrode D4 arranged at both outer ends of the two first initialization channel areas, respectively.

The operation-control thin-film transistor T5 may include an operation-control gate electrode G5 overlapping an operation-control channel area, and an operation-control source electrode S4 and an operation-control drain electrode D5 arranged at both ends of the operation-control channel area, respectively. The operation-control drain electrode D5 may be connected to the driving source electrode S1.

The light emission control thin-film transistor T6 may include a light emission control gate electrode G6 overlapping a light emission control channel area, and a light emission control source electrode S6 and a light emission control drain electrode D6 arranged at both ends of the light emission control channel area, respectively. The light emission control source electrode S6 may be connected to the driving drain electrode D1.

The second initialization driving thin-film transistor T7 may include a second initialization gate electrode G7 overlapping a second initialization channel area, and a second initialization source electrode ST and a second initialization drain electrode D7 arranged at both ends of the second initialization channel area, respectively.

The auxiliary thin-film transistor TFT may be connected to signal lines (e.g., a scan line SL, a previous scan line SL-1, a light emission control line EL, and a driving gate electrode DL), an initialization voltage line VL, and the driving voltage line PL.

On the semiconductor layer 1130, the scan line SL, the previous scan line SL-1, the light emission control line EL, and the driving gate electrode G1 may be arranged to have an insulating layer (insulating layers) therebetween.

The scan line SL may extend in a first direction. Regions of the scan line SL may correspond to the switching gate channel G2 and the compensation gate electrode G3. For example, regions of the scan line SL overlapping with the switching channel area of the switching thin-film transistor T2 and the two compensation channel areas of the compensating thin-film transistor T3 may be the switching gate channel G2 and the compensation gate electrode G3.

The previous scan line SL-1 extends in the first direction. Some regions of the previous scan line SL-1 may correspond to the first and second initialization gate electrodes G4 and G7. For example, regions of the previous scan line SL-1 overlapping with the two first initialization channel areas of the first initialization driving thin-film transistors T4 and the second initialization channel area of the second initialization driving thin-film transistor T7 may be the first and second initialization gate electrodes G4 and G7, respectively.

The light emission control line EL extends in the first direction. Regions of the light emission control line EL may correspond to the operation-control gate electrode G5 and light emission control gate electrode G6. For example, regions of the light emission control line EL overlapping with the operation-control channel area of the operation-control thin-film transistor T5 and the light emission control channel area of the light emission control thin-film transistor T6 may be the operation-control and light emission control gate electrodes G5 and G6, respectively.

The driving gate electrode G1 is a floating electrode, and may be connected to the compensation thin-film transistor T3 via a node connection line 1174 described above.

An electrode voltage line HL may be arranged on the scan line SL, the previous scan line SL-1, the light emission control line EL, and the driving gate electrode G1 to have an insulating layer (insulating layers) therebetween.

The electrode voltage line HL may extend in the first direction to cross the data line DL and the driving voltage line PL. A part of the electrode voltage line HL may cover at least a part of the driving gate electrode G1, and together with the driving gate electrode G1 constitute a storage capacitor Cst. For example, the driving gate electrode G1 may be a first storage capacitive plate CE1 of the storage capacitor Cst, and a part of the electrode voltage line HL may be a second storage capacitive plate CE2 of the storage capacitor Cst.

The second storage capacitive plate CE2 of the storage capacitor Cst is electrically connected to the driving voltage line PL. In relation to this, the electrode voltage line HL may be connected to the driving voltage line PL on the electrode voltage line HL via a contact hole CNT. Accordingly, the electrode voltage line HL may have a same voltage level (e.g., a constant voltage) as that of the driving voltage line PL. For example, the electrode voltage line HL may have a constant voltage of about +5 V. The electrode voltage line HL may be understood as a driving voltage line in a transverse direction.

The driving voltage line PL extends in a second direction, and the electrode voltage line HL is electrically connected to the driving voltage line PL and extends in the first direction crossing the second direction. Thus, a plurality of driving voltage lines PL and a plurality of electrode voltage lines HL may constitute a mesh structure in a display area.

On the electrode voltage lines HL, the data line DL, the driving voltage line PL, an initialization connection line 1173, and a node connection line 1174 may be arranged to have an insulating layer (e.g., insulating layers) therebetween. For example, insulating layers may be disposed between each of the layers of the data line DL, the driving voltage line PL, an initialization connection line 1173, and a node connection line 1174.

The data line DL may extend in the second direction and may be connected to the switching source electrode S2 of the switching thin-film transistor T2 via the contact hole 1154. A part of the data line DL may be understood as a switching source electrode S2.

The data line DL may extend in the second direction and, as described above, may be connected to the electrode voltage line HL via the contact hole CNT. In addition, the driving voltage line PL may be connected to the operation-control thin-film transistor T5 via a contact hole 1155. The driving voltage line PL may be connected to the operation-control source electrode S5 via the contact hole 1155.

An end of the initialization connection line 1173 is connected to the first and second initialization driving thin-film transistors T4 and T7 via a contact hole 1152, and the other end of the initialization connection line 1173 may be connected to the initialization voltage line VL via the contact hole 1151.

An end of the node connection line 1174 is connected to the compensation drain electrode D3 via a contact hole 1156. The other end of the node connection line 1174 may be connected to the driving gate electrode G1 via the contact hole 1157.

The initialization voltage line VL may be arranged on the data line DL, the driving voltage line PL, the initialization connection line 1173, and the node connection line 1174, to have an insulating layer (or, e.g., insulating layers) between the initialization voltage line VL and the data line DL, the driving voltage line PL, the initialization connection line 1173, and the node connection line 1174.

The initialization voltage line VL extends in the first direction. The initialization voltage line VL may be connected to the first and second initialization driving thin-film transistors T4 and T7 via the initialization connection line 1173. The initialization voltage line VL may have a constant voltage (e.g., about −2 V, etc.)

The initialization voltage line VL is arranged on a same layer as the pixel electrode 210 of the organic light-emitting diode OLED (shown in, e.g., FIG. 8) and include a same material as that of the pixel electrode 210. The pixel electrode 210 may be connected to the light emission control thin-film transistor T6. The pixel electrode 210 is connected to connection metal 1175 via a contact hole 1163. The connection metal 1175 may be connected to the light emission control drain electrode D6 via a contact hole 1153.

As described above, the semiconductor layer 1130 of the auxiliary thin-film transistors TFT is arranged on the substrate 100 to constitute main layers of a plurality of thin-film transistors including the driving thin-film transistor T1, the switching thin-film transistor T2, the compensating thin-film transistor T3, the first initialization driving thin-film transistor T4, the operation-control thin-film transistor T5, the light-control thin-film transistor T6, and the second initialization driving thin-film transistor T7. When an optical signal or a sound signal of the component 20 is directly transmitted to the semiconductor layer 1130, leaked current may occur in each of the auxiliary thin-film transistors TFT' such as the driving thin-film transistor T1, the switching thin-film transistor T2, the compensating thin-film transistor T3, the first initialization driving thin-film transistor T4, the operation-control thin-film transistor 15, the light-control thin-film transistor T6, and the second initialization driving thin-film transistor T7 to thereby obstruct accurate operation.

Figure 6:
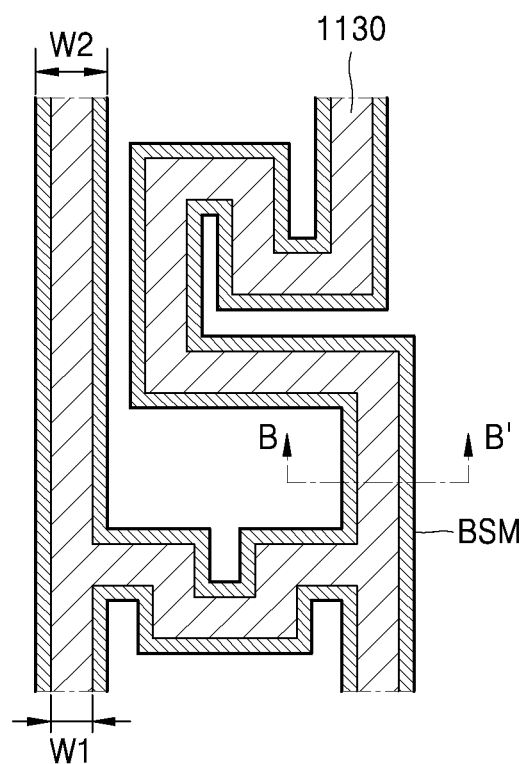
FIG. 6 is a plan view of a semiconductor layer and a blocking layer from FIG. 5, according to an exemplary embodiment of the present inventive concept.

Accordingly, to prevent leakage of current, the blocking layer BSM is arranged below the semiconductor layer 1130 as shown in FIG. 6. The blocking layer BSM is arranged between the component 20 disposed below the substrate 100 and the semiconductor layer 1130 disposed above the substrate 100 to thereby block an optical signal or a sound signal emitted directly to the semiconductor layer 1130 from the component 20. Since the blocking layer BSM may include a molybdenum (Mo) material, a thickness t1 (shown in FIG. 7) of the blocking layer BSM may be about 800 Å to perform a blocking function. However, when the blocking layer BSM having a thickness of about 800 Å or greater is arranged only in some regions below the semiconductor layer 1130, for example, only a position in which the auxiliary thin-film transistors TFT' is arranged, a risk of a wire disconnection in the semiconductor layer 1130 may increase due to a height difference. The auxiliary thin-film transistors TFT' includes the driving thin-film transistor T1, the switching thin-film transistor T2, the compensating thin-film transistor T3, the first initialization driving thin-film transistor T4, the operation-control thin-film transistor T5, the light-control thin-film transistor T6, and the second initialization driving thin-film transistor T7. Accordingly, in the present embodiment, to prevent a risk of wire disconnection, the blocking layer BSM may have a same pattern as that of the semiconductor layer 1130 to thereby cover a whole area of the semiconductor layer 1130. To block the semiconductor layer 1130, a width W2 of the blocking layer BSM is greater than a width W1 of the semiconductor layer 1130 (W1<W2).

Figure 7A:
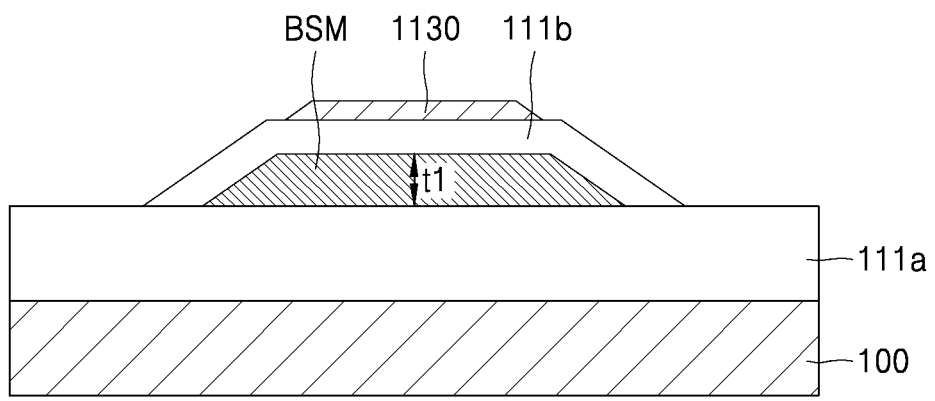
FIG. 7A is a cross-sectional view of the semiconductor layer and the blocking layer taken along a line B-B' of FIG. 6, according to an exemplary embodiment of the present inventive concept.
Figure 7B:
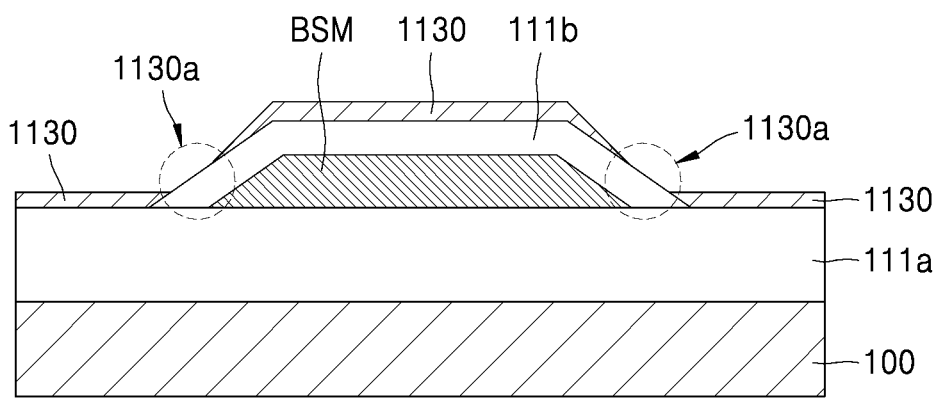
FIG. 7B is a cross-sectional view illustrating a situation of a wire disconnection when a blocking layer is arranged below some regions of a semiconductor layer in a comparative example.

Here, a problem of a wire disconnection that may be caused by a height difference between, for example, the blocking layer BSM and the semiconductor layer 1130 may be understood by FIGS. 7A and 7B. FIG. 7A illustrates a structure of the semiconductor layer 1130 and the blocking layer BSM taken along a line B-B' of FIG. 6 according to an exemplary embodiment of the present inventive concept FIG. 7B illustrates an example in which the blocking layer BSM is arranged only below some regions of the semiconductor layer 1130 according to a comparative example.

FIG. 7A shows a structure in which the blocking layer BSM is arranged below a whole area of the semiconductor layer 1130 in the present embodiment. Since the semiconductor layer 1130 is arranged only on the blocking layer BSM without having to be arranged on surface levels of different heights due to the thickness of the blocking layer BSM, a wire disconnection problem that may be caused by the height difference does not occur.

However, as shown in FIG. 7B, when the blocking layer BSM is only below some regions of the semiconductor layer 1130, the semiconductor layer 1130 is, for example, arranged on a low surface level and a high surface level, each caused by a height difference due to the thickness of the blocking layer BSM. In this case, since the height difference increases, the thicker the blocking layer BSM is, the more likely a wire disconnection portion 1130a is to be caused. Accordingly, in the present embodiment, as shown in FIG. 6, as the blocking layer BSM includes a same pattern as that of the semiconductor layer 1130 to thereby cover the whole area of the semiconductor layer 1130, a risk of a wire disconnection that may be caused by a height difference may be resolved.

Figure 8:
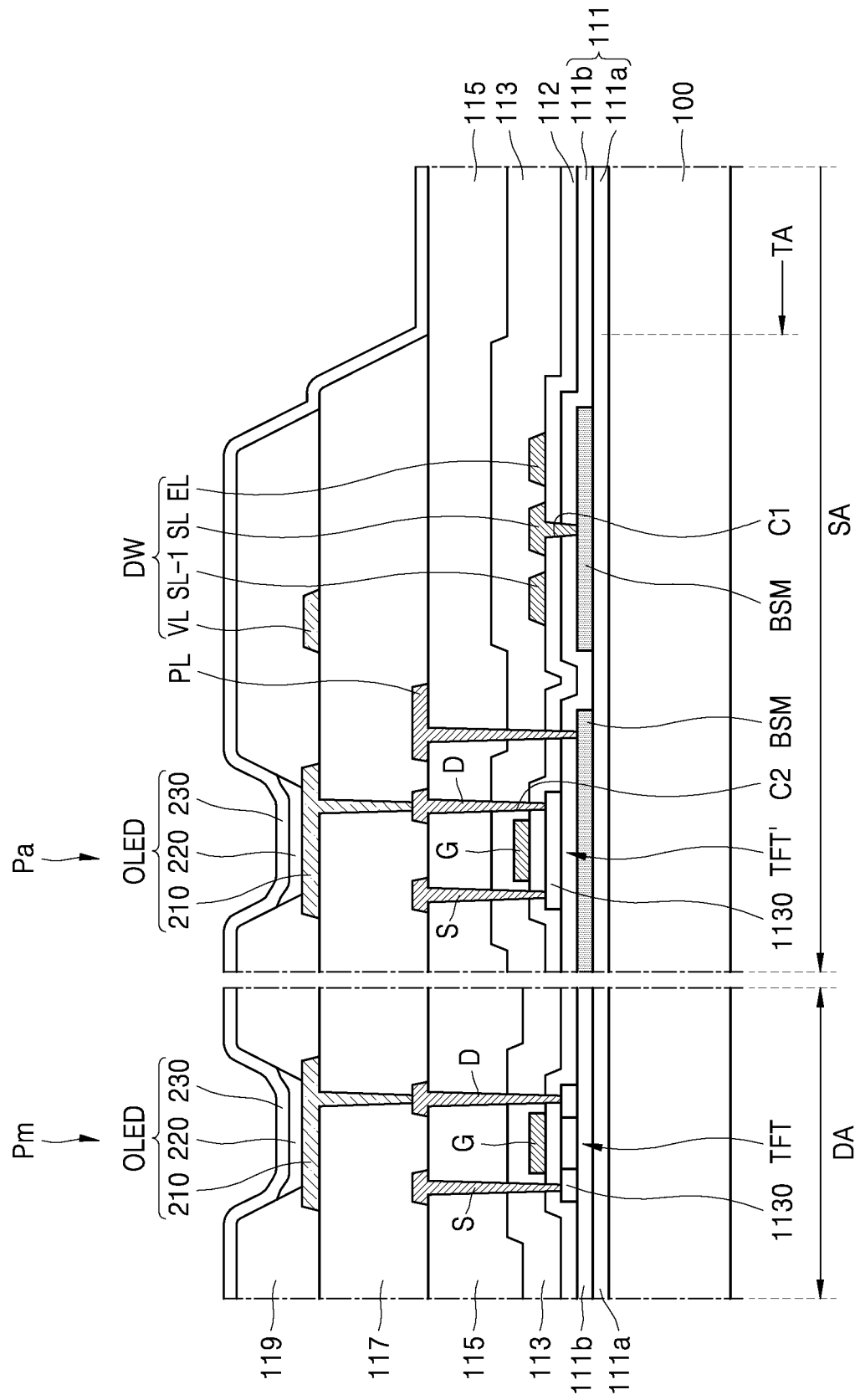
FIG. 8 is a cross-sectional view of the auxiliary pixel and the main pixel of FIG. 4, according to an exemplary embodiment of the present inventive concept.

Hereinafter, referring to FIG. 8, structures of cross-sections of the auxiliary pixels Pa and the main pixels Pm having the above-described characteristics are described. It may be understood that FIG. 8 is a view of a stacked structure on the substrate 100 schematically shown in FIG. 2.

For example, the substrate 100 may include glass or a polymer resin. A polymer resin may include PES, polyacrylate, PEI, PEN, PET, PPS, PAR, PI, PC, CAP, etc. The substrate 100 including a polymer resin may be flexible, rollable, and/or bendable. The substrate 100 may have a multi-layered structure including a layer including the above-described polymer resin, and an inorganic layer.

A buffer layer 111 is arranged on the substrate 100. The buffer layer 111 may reduce or block penetration of a foreign substance, moisture, or external air from below the substrate 100, and provide a flat surface onto the substrate 100. The buffer layer 111 may include an inorganic material such as oxide or nitride, an organic material, or a composite of an organic material and an inorganic material. The buffer layer 111 may include a single-layered or multi-layered structure including an inorganic material and an organic material. Between the substrate 100 and the buffer layer 111, a barrier layer may be further included. The barrier layer may block penetration of external air. The buffer layer 111 may have a structure in which the first buffer layer 111*a* and a second buffer layer 111*b* are stacked.

A gate electrode G is arranged on the semiconductor layer 1130 with a first gate insulating layer 112 disposed therebetween. The gate electrode G may have a single-layered or multi-layered structure including, for example, Mo, aluminum (Al), copper (Cu), titanium (Ti), etc. As an example, the gate electrode G may have a single layer including Mo. The scan line SL, the previous scan line SL-1, and the light emission control line EL may be arranged on a same layer as that of the gate electrode G. For example, the gate electrode G, the scan line SL, the previous scan line SL-1, and the light emission control line EL may be arranged on the first gate insulating layer 112.

The first gate insulating layer 112 may include, for example, silicon oxide ($SiO_2$), silicon nitride ($SiN_x$), silicon oxynitride (SION), aluminum oxide ($Al_2O_3$), titanium oxide ($TiO_2$), tantalum pentaoxide ($Ta_2O_5$), hafnium oxide ($HfO_2$), zinc peroxide ($ZnO_2$), or the like.

A second gate insulating layer 113 may be included to cover the gate electrode G. The second gate insulating layer 113 may include, for example, $SiO_2$, $SiN_x$, SION, $Al_2O_3$, $TiO_2$, $Ta_2O_5$, $HfO_2$, $ZnO_2$, etc.

A source electrode S, a drain electrode D, and the driving voltage line PL may be arranged on an interlayer insulating layer 115. The source electrode 5, the drain electrode D, and the driving voltage line PL may include a conductive material including, for example, Mo, Al, Cu, Ti, etc., and may include a single layer or multiple layers including the above-described material.

The drain electrode D is connected to the pixel electrode 210 of the organic light-emitting diode OLED.

A planarization layer 117 is arranged on the source electrode S, the drain electrode D, and the driving voltage line PL. The organic light-emitting diode OLED may be arranged on the planarization layer 117.

The planarization layer 117 may have a flat upper surface so that the pixel electrode 210 is disposed on a flat surface. The planarization layer 117 may have a single layer or multiple layers including an organic material. The planarization layer 117 may include a polymer such as benzocyclobutene (BCB), PI, hexamethyldisiloxane (HMDSO), polymethyl methacrylate (PMMA), or polystyrene (PS), a polymer derivative containing a phenol group, an acrylic-based polymer, an imide-based polymer, an aryl ether-based polymer, an amide-based polymer, a fluorine-based polymer, a p-xylene-based polymer, a vinyl alcohol-based polymer, or a blend thereof. The planarization layer 117 may include an inorganic material. The planarization layer 117 may include, for example, $SiO_2$, $SiN_x$, SION, $Al_2O_3$, $TiO_2$, $Ta_2O_5$, $HfO_2$, $ZnO_2$, or the like. When the planarization layer 117 includes an inorganic material, chemical polishing planarization may be performed on the planarization layer 117 according to the situation (e.g., the material of the planarization layer 117). The planarization layer 117 may include both an organic material and an inorganic material.

The pixel electrode 210 may include a (semi-)light-transmitting electrode or a reflective electrode. In an exemplary embodiment of the present inventive concept, the pixel electrode 210 may include a reflective layer including, for example, silver (Ag), magnesium (Mg), Al, platinum (Pt), palladium (Pd), gold (Au), nickel (Ni), neodymium (Nd), iridium (Ir), chrome (Cr), or a compound thereof, and a transparent or translucent electrode layer disposed on the reflective layer. The transparent or translucent electrode layer may include at least one of, for example, indium tin oxide (ITO), indium zinc oxide (IZO), zinc oxide (ZnO), indium oxide ($In_2O_3$), indium gallium oxide (IGO), and/or aluminum zinc oxide (AZO). In an exemplary embodiment of the present inventive concept, the pixel electrode 210 may include a structure in which ITO/Ag/ITO are stacked.

A pixel-defining layer 119 may be arranged on the planarization layer 117. The pixel-defining layer 119 may be formed by performing spin coating on an organic insulating material such as PI, polyamide, acrylic resin, BCB, HMDSO, phenol resin, etc.

The intermediate layer 220 of the organic light-emitting diode OLED may include an organic emissive layer. The organic emissive layer may include an organic material including a fluorescent material or a phosphorescent material emitting red, green, blue, or white light. The organic emissive layer may include a low-molecular weight organic material or a polymer organic material. Below or above the organic emissive layer, a functional layer such as a hole transport layer (HTL), a hole injection layer (HIL), an electron transport layer (ETL), an electron injection layer (EIL), etc. may be further arranged. The intermediate layer 220 may be arranged on each of a plurality of pixel electrodes 210. However, the intermediate layer 220 is not limited thereto, and may include a layer integrally arranged over a plurality of pixel electrodes 210. For example, the intermediate layer 220 may be a single layer disposed on the plurality of pixel electrodes 210. As such, the intermediate layer 220 may be variously modified.

For example, the opposite electrode 230 may be a transparent electrode or a reflective electrode. In an exemplary embodiment of the present inventive concept, the opposite electrode 230 may be a transparent or a translucent electrode, and may include a metal thin film having a low work function and including, e.g., Li, Ca, lithium-fluoride-calcium (LiF/Ca), lithium-fluoride-aluminum (LiF/Al), Al, Ag, Mg, or a compound thereof. In addition, a transparent conductive oxide (TCO) layer including, for example, ITO, IZO, ZnO or $In_2O_3$ may be further arranged over the metal thin film. The opposite electrode 230 is arranged over the display area DA and the peripheral area PA, and may be arranged above the intermediate layer 220 and the pixel-defining layer 119. The opposite electrode 230 may be arranged integrally (e.g., as a single body) over a plurality of organic light-emitting diodes OLED to correspond to the plurality of pixel electrodes 210.

When the pixel electrode 210 includes a reflective electrode and the opposite electrode 230 includes a light-transmitting electrode, and as light emitted from the intermediate layer 220 is emitted toward the opposite electrode 230, the display apparatus 1 may be a top-emission type display apparatus. When the pixel electrode 210 is a transparent or translucent electrode and the opposite electrode 230 is a reflective electrode, and as light emitted from the intermediate layer 220 is emitted toward the substrate 100, the display apparatus may be a rear-type emission type display apparatus. However, the present inventive concept is not limited thereto. In the present embodiment, the display apparatus 1 may be a dual-emission type display apparatus in which light is emitted in both front and rear directions.

In the current embodiment, the blocking layer BSM is arranged between the substrate 100 and the semiconductor layer 1130, and between the substrate 100 and a wiring unit DW on the auxiliary pixel Pa. For example, the blocking layer BSM is arranged between the component 20 and the semiconductor layer 1130 and between the component 20 and the wiring unit DW to prevent the auxiliary thin-transistor TFT and the wiring unit DW from being disturbed by an optical signal or a sound signal of the component 20. For example, with respect to the semiconductor layer 1130 of the auxiliary thin-film transistor TFT', the blocking layer BSM covers a whole area of the semiconductor layer 1130 to protect the semiconductor layer 1130 as shown in FIG. 6.

Accordingly, in such a structure, a risk of current leakage due to an optical signal or a sound signal from the component 20 may be prevented as the blocking layer BMS blocks the optical signal or the sound signal. For example, since the semiconductor layer 1130 of the auxiliary thin-film transistor TFT is sensitive to generation of current leak, a thickness of the blocking layer BSM may be about 800 Å or greater to prevent current leakage. In this case, a risk in which a wire disconnection in the semiconductor layer 1130 may be caused by a height difference due to a thickness of the blocking layer BSM may be resolved by covering a whole area of the semiconductor layer 1130 with the blocking layer BSM, as described above. For example, the blocking layer BSM may have a same pattern as that of the semiconductor layer 1130.

Accordingly, as the blocking layer BSM prevents current leakage from being caused by a signal of the component 20, operation of the component 20 and implementation of an image in the sensor area SA may be facilitated, and a wire disconnection in the semiconductor layer 1130 that may be caused by a height difference may be prevented.

Figure 9A:
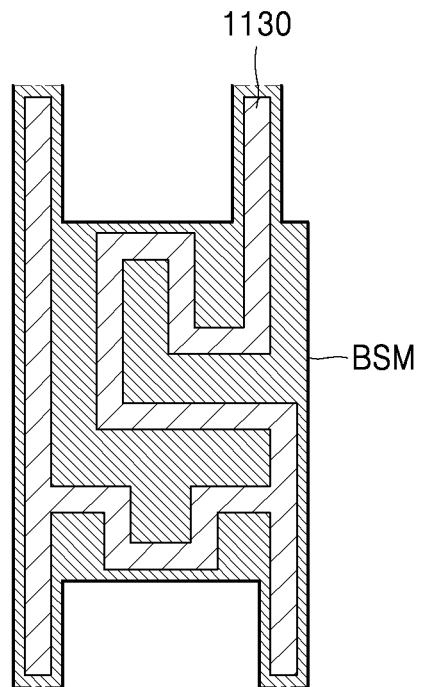
FIGS. 9A, 9B, 9C and 9D are plan views each illustrating a structure of the blocking layer of FIG. 6, according to an exemplary embodiment of the present inventive concept.
Figure 9B:
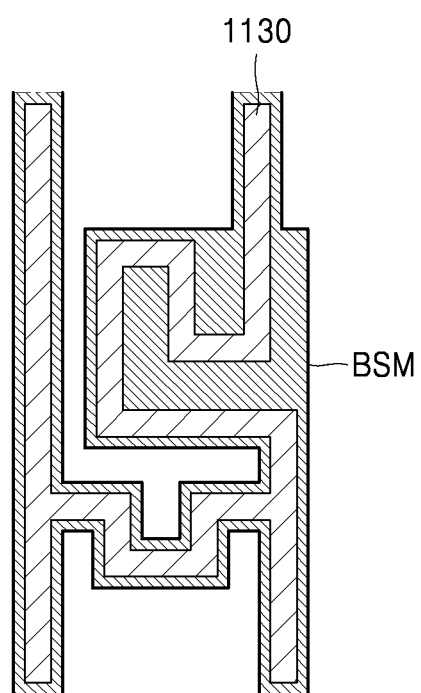
Figure 9C:
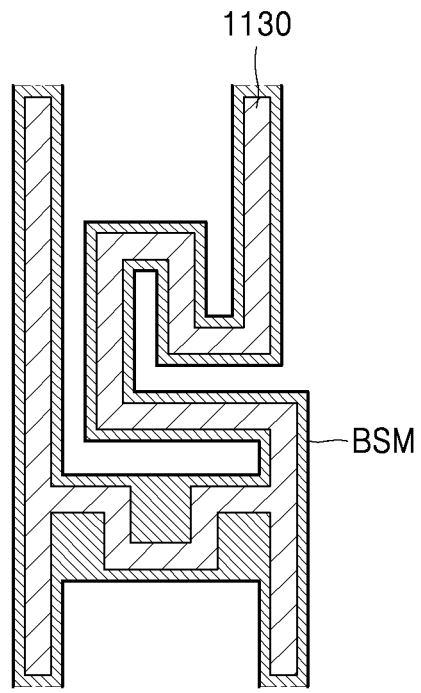
Figure 9D:
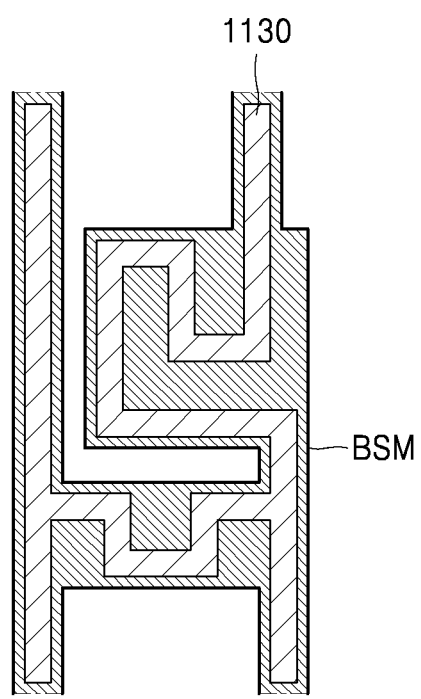

In the present embodiment, a case in which the blocking layer BSM has a same pattern as that of the semiconductor layer 1130 is described as an example. However, as shown in FIGS. 9A to 9O, the blocking layer BSM may be configured to have an area including a pattern different from that of the semiconductor layer 1130. For example, when the blocking layer BSM covers a whole area of the semiconductor layer 1130, even when the blocking layer does not have a same pattern as that of the semiconductor layer 1130, the blocking layer BSM may prevent occurrence of current leakage and obstruct a wire disconnection. For example, the blocking layer BSM may cover beyond the area of the semiconductor layer 1130.

Figure 10:
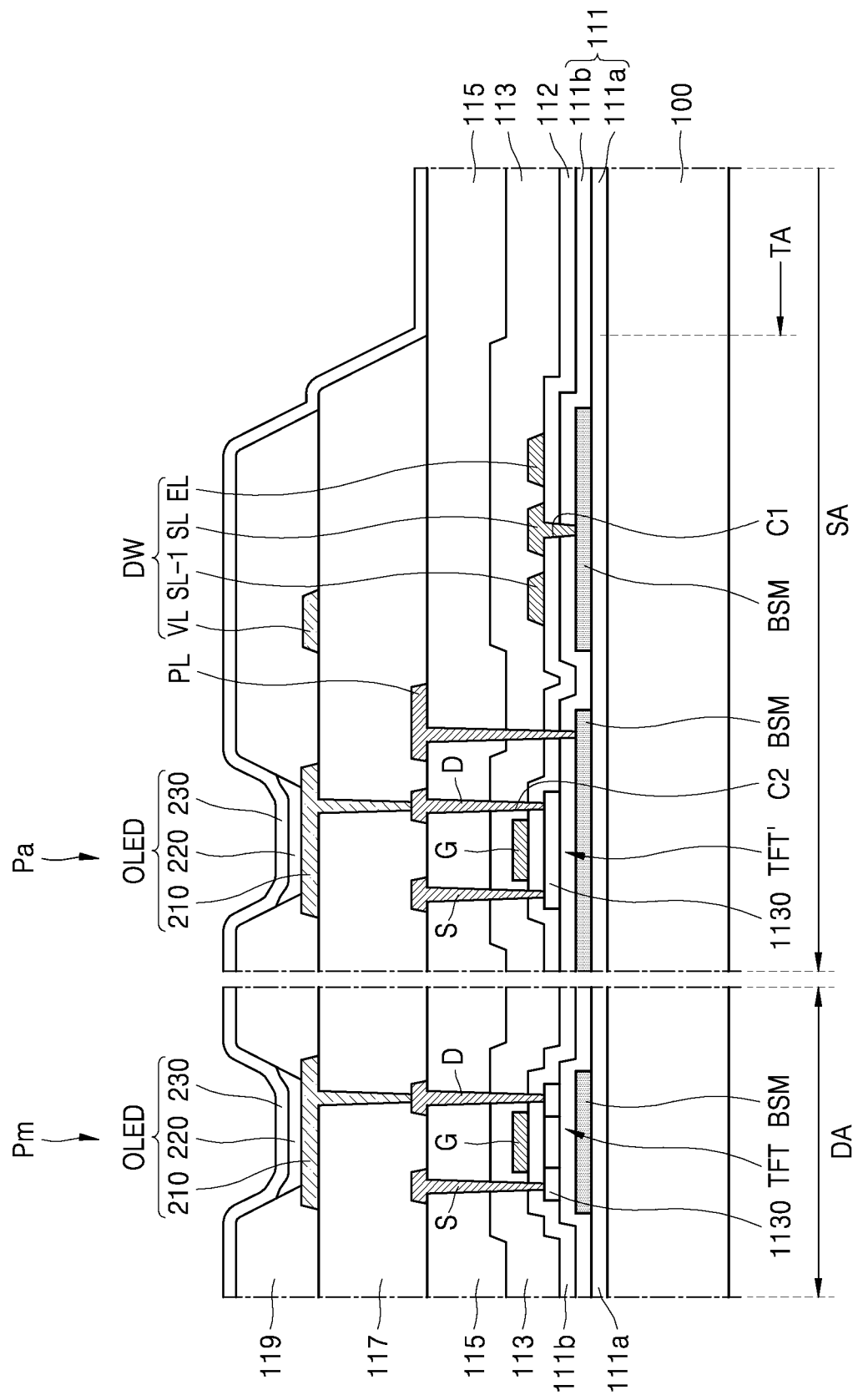
FIG. 10 is a schematic cross-sectional view of a display panel according to an exemplary embodiment of the present inventive concept.

In addition, in the above-described embodiment, as described with reference to FIG. 8, a case in which the blocking layer BSM is arranged below the auxiliary thin-film transistor TFT' in the sensor area SA is described as an example. However, as shown in FIG. 10, the blocking layer BSM may be also arranged below the main thin-film transistor TFT of the main pixel Pm to have a same material and a same pattern as those of the blocking layer BSM of the auxiliary thin-film transistor TFT'. For example, since the main pixel Pm is not arranged in the sensor area SA including the component 20, even when the blocking layer is not arranged in the main pixel Pm, might not be impacted by the component 20. However, to thoroughly block a mixture of noise caused not just by the component 20 but by another external light, the blocking layer BSM may be also arranged below the main thin-film transistor TFT of the main pixels Pm to cover a whole area of the semiconductor layer 1130.

According to an exemplary embodiment of the present inventive concept, a display apparatus may include a sensor area provided in a display area. A component such as a sensor may be arranged in the sensor area. For example, according to an exemplary embodiment, a display apparatus including a blocking layer may prevent a device from being damaged by a component. However, the present inventive concept is not limited thereto.

While the present inventive concept has been particularly shown and described with reference to exemplary embodiments thereof, it will be apparent to those of ordinary skill in the art that various changes in form and detail may be made thereto without departing from the spirit and scope of the present inventive concept.

What is claimed is:

1. A display apparatus comprising:
a substrate comprising a display area and a sensor area, wherein the display area comprises a first pixel, and the sensor area comprises a second pixel and a transmission portion;
a sensor configured to transceive a signal through the substrate via the transmission portion, wherein the sensor is disposed corresponding to the sensor area,
wherein the second pixel comprises an organic light-emitting diode and a first semiconductor layer, wherein the organic light-emitting diode is electrically connected to the first semiconductor layer, and
wherein a first blocking layer is disposed between the sensor and the first semiconductor layer in a direction substantially perpendicular to the substrate, wherein the first blocking layer fully covers the whole area of the first semiconductor layer in a top view of the substrate,
wherein when viewed in the direction horizontal to the substrate, the first blocking layer overlaps at least a portion of the organic light emitting diode connected to the first semiconductor layer.

2. The display apparatus of claim 1, wherein the first blocking layer is arranged between the sensor disposed below the substrate and the first semiconductor layer disposed above the substrate in a direction substantially perpendicular to the substrate.

3. The display apparatus of claim 1, wherein the first blocking layer has a same pattern as a pattern of the first semiconductor layer.

4. The display apparatus of claim 3, wherein a width of the pattern of the first blocking layer is greater than a width of the pattern of the first semiconductor layer.

5. The display apparatus of claim 1, wherein the first blocking layer has a different pattern from a pattern of the first semiconductor layer.

6. The display apparatus of claim 1, wherein a thickness of the first blocking layer is about 800 Å or greater.

7. The display apparatus of claim 1, wherein buffer layers are arranged between the first semiconductor layer and the first blocking layer and between the first blocking layer and the substrate, respectively.

8. The display apparatus of claim 1, wherein the first pixel comprises a second semiconductor layer, and
wherein a second blocking layer is arranged between the sensor and the second semiconductor layer to cover the second semiconductor layer.

9. The display apparatus of claim 8, wherein the first pixel further comprises an organic light-emitting diode connected to the second semiconductor layer.

10. The display apparatus of claim 1, wherein the signal comprises an optical signal and/or a sound signal.

11. The display apparatus of claim 1, wherein the first pixel comprises a second semiconductor layer, and wherein when viewed in the direction horizontal to the substrate, the first blocking layer does not overlap the second semiconductor layer.

* * * * *